United States Patent
Sundermeyer et al.

(10) Patent No.: US 12,091,427 B2
(45) Date of Patent: Sep. 17, 2024

(54) METAL COMPLEXES FOR GAS-PHASE THIN-FILM DEPOSITION

(71) Applicant: Umicore AG & Co. KG, Hanau-Wolfgang (DE)

(72) Inventors: Joerg Sundermeyer, Marburg (DE); Henrik Schumann, Weinbach (DE); Wolf Schorn, Waldbronn (DE); Nicholas Rau, Marburg (DE); Annika Frey, Hanau (DE); Ralf Karch, Kleinostheim (DE); Eileen Woerner, Nidderau (DE); Angelino Doppiu, Seligenstadt (DE)

(73) Assignee: Umicore AG & CO. KG, Hanau-Wolfgang (DE)

( * ) Notice: Subject to any disclaimer, the term of this patent is extended or adjusted under 35 U.S.C. 154(b) by 457 days.

(21) Appl. No.: 17/599,126

(22) PCT Filed: Mar. 27, 2020

(86) PCT No.: PCT/EP2020/058865
§ 371 (c)(1),
(2) Date: Sep. 28, 2021

(87) PCT Pub. No.: WO2020/193794
PCT Pub. Date: Oct. 1, 2020

(65) Prior Publication Data
US 2022/0153768 A1   May 19, 2022

(30) Foreign Application Priority Data
Mar. 28, 2019  (EP) ..................... 19165935

(51) Int. Cl.
*C07F 15/00* (2006.01)
*C23C 16/18* (2006.01)
*C23C 16/455* (2006.01)

(52) U.S. Cl.
CPC ...... *C07F 15/0033* (2013.01); *C07F 15/0046* (2013.01); *C23C 16/18* (2013.01); *C23C 16/45553* (2013.01)

(58) Field of Classification Search
CPC ... C07F 15/0033; C07F 15/0046; C07F 17/02
See application file for complete search history.

(56) References Cited

U.S. PATENT DOCUMENTS

| 2014/0051878 A1 | 2/2014 | Sundermeyer et al. |
| 2018/0155379 A1 | 6/2018 | Schmiege et al. |

FOREIGN PATENT DOCUMENTS

| CN | 103380139 A | 10/2013 |

OTHER PUBLICATIONS

G. Natile, et al., 8 Journal of the Chemical Society, Dalton Transactions 1262-1265 (1979) (Year: 1979).*
Binns et al., "An unsuccessful approach to the framework of the antimalarial, arteether" Tetrahedron Letters, vol. 30, No. 9, 1989, pp. 1125-1128.
Cardenas et al., "Aliphatic Palladation of Ketone N,N-Dimethylhydrazones" Organometallics, Organometallics, vol. 13, 1994, pp. 882-889.
Corey et al., "A new and unusually flexible scheme for annulation to form fused cyclohexenone units" Tetrahedron Letters, vol. 47, 1978, pp. 4597-4600.
Corey et al., "Synthesewege zu polyfunktionellen Molekülen über metallierte Dimethylhydrazone", Chem. Ber., vol. 111, 1978, pp. 1362-1383.
Enders et al., "Synthesis of Spiroacetal Pheromones via Metalated Hydrazones", Synthesis, vol. 11, 1990, pp. 1013-1019.
Fujisawa et al., "A convenient method for the synthesis of 7-OXO-E-3-alkenoic acids by the reaction of β-vinyl-β-propiolactone with metallated N, N-dimethylhydrazones", Chemistry Letters, 1982, pp. 1521-1524.
Geant et al., "Stereoselective divergent synthesis of 1,2-aminoalcohol-containing heterocycles from a common chiral nonracemic building block", Tetrahedron Asymmetry, vol. 27, 2016, pp. 22-30.
International Preliminary Report on Patentability received for PCT Patent Application No. PCT/EP2020/058865, mailed on Oct. 7, 2021, 14 pages (8 pages of English Translation and 6 pages of Original Document).
International Search Report and Written Opinion received for PCT Patent Application No. PCT/EP2020/058865, mailed on May 27, 2020, 18 pages (8 pages of English Translation and 10 pages of Original Document).
Javed et al., "Synthesis of (Hydrazonido)aluminum Complexes", Eur. J. Inorg. Chem., 2008, pp. 5251-5256.
Javed et al., "Synthesis of Zinc Hydrazonide Complexes", Inorganic Chemistry, vol. 47, 2008, pp. 11984-11992.
Qi et al., "Calcium(II)-Catalyzed Intra- and Intermolecular Hydroamidation of Unactivated Alkenes in Hexafluoroisopropanol", ACS Catalysis, vol. 8, 2018, pp. 1734-1739.
Sedai et al., "Volatility enhancement in calcium. strontium. and barium complexes containing .beta.-diketiminate ligands with dimethylamino groups on the ligand core nitrogen atoms", Organometallics, vol. 28, No. 4, 2009, pp. 1032-1038.
Wiley et al., "Dimethylhydrazones of Aliphatic, Aromatic, and Heterocyclic Aldehydes and their infrared Absorption Characteristics", J. Org. Chem., vol. 22, 1957, pp. 204-207.

* cited by examiner

*Primary Examiner* — Alexander R Pagano
*Assistant Examiner* — Frank S. Hou
(74) *Attorney, Agent, or Firm* — Faegre Drinker Biddle & Reath LLP

(57) ABSTRACT

Metal complexes of formula (I) are described:

$$[M(L^1)_x(L^2)_y(hydra)_z]_n \quad \text{formula (I)}$$

wherein:
M=metal atom having an atomic number selected from the ranges a) through c):
 a) 12, 21 to 34, with the exception of 30,
 b) 39 to 52, with the exception of 48,
 c) 71 to 83, with the exception of 80,
$L^1$=neutral or anionic ligand, with x=0 or 1,
$L^2$=neutral or anionic ligand, with y=0 or 1,
(hydra)=acetone dimethylhydrazone monoanion, with z=1, 2, or 3,
n=1 or 2, and
the total charge of the complex is 0.

13 Claims, No Drawings

METAL COMPLEXES FOR GAS-PHASE THIN-FILM DEPOSITION

CROSS-REFERENCE TO RELATED APPLICATIONS

This application is a national stage application (under 35 U.S.C. § 371) of PCT/EP2020/058865, filed Mar. 27, 2020, which claims benefit of European Application No. 19165935.8, filed Mar. 28, 2019, both of which are incorporated herein by reference in their entirety.

The invention relates to metal complexes with acetone dimethylhydrazone ligands. The invention also relates to methods for producing the metal complexes and to uses of the metal complexes in CVD processes and ALD processes. The invention further relates to methods in which the metal complexes are used as precursors and to metallized surfaces obtainable with the metal complexes.

PRIOR ART

The surface of a substrate can be metallized in various ways. The surface of a substrate can be metallized, for example, by means of gas-phase thin-film deposition. Exemplary gas-phase thin-film depositions include the CVD (chemical vapor deposition) process and the ALD (atomic layer deposition) process. In these methods, a metal is deposited from the gas phase on a surface of a substrate.

In the gas phase, the metal is typically present as a gaseous precursor substance. Such substances are also referred to as precursors. Due to use in the gas phase, the precursors should be as volatile as possible. Metal complexes are often used as precursors for metals.

Suitable precursors for the deposition of, for example, ruthenium or indium basically include (methylcyclopentadienyl)$_2$Ru, (dimethylpentadienyl)$_2$Ru, (arene)Ru(1,4-diaza-1,3-butadiene), Me$_3$In, and [3-dimethylamino)propyl] dimethylindium. Known precursors have various disadvantages. (Methylcyclopentadienyl)$_2$Ru is, for example, thermally comparatively stable and does not allow high deposition rates of ruthenium. These precursors can also lead to an incorporation of carbon.

Overall, precursors for the deposition of metals on substrate surfaces by means of gas-phase thin-film deposition still require improvement. Some of the known precursors have too low a synthetic accessibility. Some of the known precursors have too high decomposition temperatures. Some of the known precursors have excessively high incorporation rates of carbon and other impurities in the production of thin metal layers. With some of the known precursors, there is a preferred separation of only a weakly-bound ligand. These precursors are therefore unsuitable for ALD processes. Some of the known precursors are insufficiently volatile and/or not liquid at room temperature.

In an industrial application, it is also of particular interest that as few steps as possible lead to the desired product in the synthesis of precursors for metals. Harsh reaction conditions should be avoided in the synthesis. The precursors should be obtained in as high a yield as possible. The precursors should be durable at room temperature for a long time. The precursors should withstand heating of a reservoir for gas-phase thin-film methods, such as a so-called bubbler, to temperatures up to 100° C. in order to increase vapor pressure. The precursors should decompose exothermically under typical conditions of gas-phase thin-film methods—in particular, at elevated temperatures.

Fujisawa et al. describe cuprates with acetone dimethylhydrazone ligands and lithium or magnesium bromide as cationic species.[1] They were formed only in situ as reactants in the synthesis of 7-oxo-(E)-3-alkanoic acids by reaction with β-vinyl-β-propiolactone. Cárdenas et al. describe palladium complexes with acetophenone dimethylhydrazone, triphenylphosphine, and halide ligands.[2] S. Javed et al. describe zinc and aluminum complexes with acetone dimethylhydrazone ligands.[3],[4] The decomposition behavior of these complexes—particularly in thermolysis—was not analyzed. Complexes of acetone dimethylhydrazone ligands with other metals can undergo an unwanted reductive elimination of the acetone dimethylhydrazone ligands. This regularly results in an unstable complex.

Aim of the Invention

The aim of the invention is to provide metal complexes that overcome the above-described disadvantages at least in part and, if possible, in whole.

The aim underlying the invention is, in particular, to provide metal complexes that have the advantageous properties described above. The metal complexes shall have high volatility. The metal complexes are to be as liquid as possible at room temperature. The metal complexes shall still be stable at higher temperatures. The metal complexes are not to have too high decomposition temperatures.

The aim of the invention is also to ensure good synthetic accessibility of the metal complexes—in particular, via syntheses having few steps. It is also an aim of the invention that the synthesis of the metal complexes not require harsh reaction conditions and give as high yields as possible.

Disclosure of the Invention

Surprisingly, the aims of the invention are achieved by metal complexes according to the claims.

The subject matter of the invention is a metal complex of formula (I):

$$[M(L^1)_x(L^2)_y(\text{hydra})_z]_n \qquad \text{formula (I)}$$

wherein:
M=metal atom having an atomic number selected from the ranges a) through c):
 a) 12, 21 to 34, with the exception of 30,
 b) 39 to 52, with the exception of 48,
 c) 71 to 83, with the exception of 80,
L$^1$=neutral or anionic ligand, with x=0 or 1,
L$^2$=neutral or anionic ligand, with y=0 or 1,
(hydra)=acetone dimethylhydrazone monoanion, with z=1, 2, or 3, and
n=1 or 2, and
the total charge of the complex is 0.

As is common in chemistry, the atomic number for the metal atom M indicates the position of the metal atom M in the periodic table of elements. Accordingly, the atomic numbers or metals defined with the ranges a) through c) are the following:
 a) 12 (Mg), 21 (Sc), 22 (Ti), 23 (V), 24 (Cr), 25 (Mn), 26 (Fe), 27 (Co), 28 (Ni), 29 (Cu), 31 (Ga), 32 (Ge), 33 (As), and 34 (Se);
 b) 39 (Y), 40 (Zr), 41 (Nb), 42 (Mo), 43 (Tc), 44 (Ru), 45 (Rh), 46 (Pd), 47 (Ag), 49 (In), 50 (Sn), 51 (Sb), and 52 (Te);
 c) 71 (Lu), 72 (Hf), 73 (Ta), 74 (W), 75 (Re), 76 (Os), 77 (Ir), 78 (Pt), 79 (Au), 81 (Tl), 82 (Pb), and 83 (Bi).

According to the invention, the metal atom M does not have the atomic number 30 (Zn; M is not zinc), the atomic number 48 (Cd; M is not cadmium), or the atomic number 80 (Hg; M is not mercury).

The metal atom M can have different oxidation states—preferably oxidation state +I, +II, +III, +IV, +V, +VI, or +VII. The metal atom is formally positively charged and can be indicated by $M^{a+}$, wherein a=1, 2, 3, 4, 5, 6, or 7. It is preferred according to the invention that the oxidation state be +I, +II, +III, or +IV or a=1, 2, 3, or 4. It is preferred according to the invention that the metal atom M can be stably present under standard conditions with at least two different oxidation states.

$L^1$ and $L^2$ are independently neutral or anionic ligands, but not metals—in particular, not Li or Mg. If $L^1$ or $L^2$ is a neutral ligand, its oxidation state is ±0. $L^1$ or $L^2$ is then formally uncharged. If $L^1$ or $L^2$ is an anionic ligand, its oxidation state is preferably −I or −II, and more preferably −I. The ligand $L^1$ or $L^2$ is then formally negatively charged and can be indicated with $(L^1)^{b1-}$ or $(L^2)^{b2-}$, wherein b1, b2=1 or 2, and preferably 1. $L^1$, $L^2$, x, and y are independently selected such that the metal complex of formula (I) is neutral.

If n=1, the metal complex according to the invention is a mononuclear metal complex having one metal atom M.

If n=2, the metal complex according to the invention is a dinuclear metal complex having two metal atoms M. The two metal atoms preferably have the same atomic number. In such a case, the metal complex is a homodinuclear metal complex.

The total charge of the metal complex is 0 (zero), i.e., the metal complex is electrically neutral. The neutrality of the metal complex is reflected by the absence of a charge indication on the square bracket.

The ligand (hydra) is an acetone dimethylhydrazone monoanion. (hydra) is thus a monoanion derived from acetone dimethylhydrazone by deprotonation. The negative charge of the monoanion is delocalized in (hydra). (hydra) is also sometimes referred to herein as "[hydra](1−)" or "hydra." Acetone dimethylhydrazone is also sometimes referred to herein as "H-hydra."

If a further ligand "R" besides (hydra) is present in a (hydra) metal complex, this may result in reductive elimination. In that case, (hydra) together with R is separated as R-(hydra). The remaining metal atom is reduced at the same time. In that case, two negative charges pass over to the metal atom. A corresponding metal therefore has at least two stable oxidation states, the difference of which amounts to two charges.

Known metal complexes with the ligand (hydra) are formed by metals which do not have two stable oxidation states whose difference amounts to two charges or whose d shell is fully occupied (Li, Al, and Zn). Such (hydra) metal complexes do not tend to reductively eliminate (hydra). Accordingly, stability of such complexes is to be expected.

In contrast, for (hydra) metal complexes of metals having at least two stable oxidation states with a difference of two charges and/or with a non-closed d shell, a tendency towards reductive elimination of (hydra) is to be expected. Accordingly, for such (hydra) metal complexes, difficultly of preparation and low stability were to be expected in prior art.

Surprisingly, it has been found within the scope of the present invention that (hydra) metal complexes of such metals with atomic numbers from the ranges a), b), and c) can also be easily prepared. Surprisingly, it has also been found within the scope of the present invention that the (hydra) metal complexes according to the invention are stable—in particular, are not subject to spontaneous decay.

For metal complexes according to the invention, reductive elimination also plays a role in forced decomposition—in particular, thermolysis—of the metal complexes. Ligands of a (meta)stable metal complex are regularly separated as a radical in the event of forced decomposition of the metal complex. For example, this is regularly the case with cyclopentadienyl ligands. Other fragmentation pathways are expected for the ligand (hydra). Without being bound by theory, it is assumed within the scope of the present invention that the ligand (hydra), upon decomposition of the metal complexes according to the invention, allows for an easy separation of the N—N bond in the ligand backbone.

In particular, reductive elimination of the ligand (hydra) is expected upon decomposition of the metal complex according to the invention. Reductive elimination of the ligand (hydra) may occur, in particular, in the event of thermolysis of a metal complex according to the invention.

In the metal complex according to the invention, a ligand (hydra) is present alongside at least one further ligand R. (hydra) can be eliminated reductively together with the at least one further ligand R. R is preferably H, alkyl, or also (hydra). In the event of decomposition or thermolysis, reductive elimination of R-(hydra) may occur according to the following scheme:

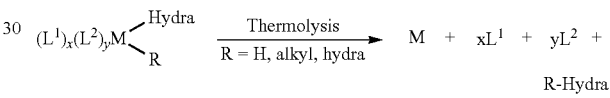

Reductive elimination forms a selective, thermal decay path. The reductive elimination of R-hydra reduces M. M may be deposited metallically. Due to this assumed decay path, the metal complexes according to the invention are particularly suitable for gas-phase thin-film methods for metallizing substrate surfaces.

The metal complexes according to the invention comprise complexes of the transition metals. Such metal complexes are formed by transition metal atoms M with an atomic number of 21 to 29, 39 to 47, or 71 to 79. Particularly preferred metal atoms are Ti, Co, Ru, Pd, Ir, and Au. These transition metal atoms have unoccupied or partially occupied d-orbitals. This means that the transition metal atoms have a d-electron configuration of $d^0$ to $d^9$. For complexes according to the invention having the aforementioned transition metals, selective, thermal decay via reductive elimination of R-hydra is expected.

Transition metals with a fully-occupied d-shell, i.e., with a $d^{10}$ electron configuration, are not included according to the invention. Without being bound by theory, it is believed that, because of their closed, stable $d^{10}$ shell, (hydra) metal complexes of transition metals having a $d^{10}$ electron configuration behave similarly to (hydra) metal complexes of main group metals of the 2nd and 3rd period—in particular, of Li and Al. Such (hydra) metal complexes do not regularly undergo reductive elimination of R-(hydra). Accordingly, neither reductive elimination nor the use in gas-phase thin-film methods is known for (hydra) metal complexes having the transition metal zinc, M=Zn with $d^{10}$ electron configuration.

The metal complexes according to the invention also comprise complexes of main group metals of the p-block—especially, of the 3rd, 4th, 5th, and 6th period of the periodic table of elements. These are formed by main group metal atoms M having an atomic number of 12, 31 to 34, 49 to 52, or 81 to 83. Particularly preferred metal atoms M are Ga, Ge, As, Se, In, Sb, Te, and Bi. For complexes of these main group metals with the ligand (hydra) according to the invention, selective, thermal decay via reductive elimination of R-(hydra) is expected.

In contrast, (hydra) metal complexes of Li or Al do not regularly undergo reductive elimination of R-(hydra). Accordingly, for (hydra) metal complexes with M=Li or Al, neither reductive elimination nor the use in gas-phase thin-film methods is known.

According to the invention, it is preferred that, in the metal complex, M be selected from Ti, Co, Ga, Ge, As, Se, Ru, Pd, In, Sb, Te, Ir, Au, and Bi, and more preferably selected from Co, Ga, Ge, Ru, In, and Ir. Such a metal complex can serve to coat substrate surfaces with a particularly advantageous metal. Such a metal complex can lead to particularly low incorporation rates of carbon and other impurities in case of such a coating. In case of such a metal complex, upon decomposition, reductive elimination of (hydra) with reduction of Ti, Co, Ga, Ge, As, Se, Ru, Pd, In, Sb, Te, Ir, Au, or Bi can be effected more easily.

According to the invention it is preferred that, in the metal complex, $L^1$ and $L^2$, independently of one another, be selected from Cl, H, methyl, ethyl, propyl, isopropyl, tert-butyl, cyclopentadienyl, methylcyclopentadienyl, isopropylcyclopentadienyl, arene, phosphine, isonitrile, and carbonyl. Because of the ligands selected, such a metal complex may be volatile and, at room temperature, liquid. Such a metal complex may be stabilized by the selected ligands.

"Arene" means an aromatic hydrocarbon, according to the *International Union of Pure and Applied Chemistry*. Arenes are p-azide compounds. Arenes include both monocyclic and polycyclic aromatic hydrocarbons. An arene used according to the invention may, optionally, be substituted. Optional substituents of the arene are sometimes referred to herein as $(R^1)_m$. Preferably, the index m may be 0, 1, 2, 3, 4, 5, or 6—more preferably 0 or 2, and particularly preferably 2. According to the invention, $R^1$ is preferably selected from hydrocarbon radicals, hydroxy groups, alkoxy groups, amino groups, and halogens, and more preferably from hydrocarbon radicals.

In the context of the present invention, a hydrocarbon radical refers, as usual, to a radical which is composed exclusively of carbon and hydrogen. In the context of the present invention, a hydrocarbon radical generally refers to a hydrocarbon radical, which may be saturated or unsaturated. Saturated hydrocarbon radicals are preferred. In the context of the present invention, a hydrocarbon radical generally refers to a hydrocarbon radical, which may be linear, branched, or cyclic. Linear and branched hydrocarbon radicals are preferred.

According to the invention, it is preferred that, in the metal complex, x=y=1, wherein, optionally, z=1. Such a metal complex may, synthetically, be more readily accessible. In such a metal complex, the ligands $L^1$ and $L^2$ can be suitably selected as a function of the metal atom M to, on the one hand, stabilize the metal complex and, on the other, ensure its volatility. In case of such a metal complex, upon decomposition, reductive elimination of (hydra) can be effected more easily.

According to the invention, it is preferred, in one aspect, that the following apply to the metal complex of formula (I):
M=Ru,
$L^1$=arene, with x=1,
$L^2$=Cl, H, methyl, ethyl, propyl, isopropyl, or tert-butyl, with y=1,
z=1, and
n=1.

Such a preferred metal complex has the formula (Ia).

The metal complex of formula (Ia) can be very volatile and, at room temperature, liquid, but still stable at higher temperatures. The metal complex of formula (Ia) cannot have excessively high decomposition temperatures. The metal complex of formula (Ia) may, synthetically, be accessible via a few stages. In case of the metal complex of formula (Ia), upon decomposition, reductive elimination of (hydra) can be effected more easily.

According to the invention, it is preferred, for the metal complex of formula (Ia), that the arene be an arene substituted with 1 to 6 (1,2,3,4,5,6) identical or different $C_{1-8}$ ($C_{1,2,3,4,5,6,7,8}$) hydrocarbon radicals or be an unsubstituted arene. The arene is further preferably selected from 4-isopropyltoluene and benzene. 4-isopropyltoluene is also referred to as p-cymene or para-cymene. Without being bound by theory, it is expected that, in particular, the unsymmetrically substituted 4-isopropyltoluene make crystallization of the metal complex of formula (Ia) more difficult and improve its volatility and liquidity at room temperature.

According to the invention, it is preferred, for the metal complex of formula (Ia), that $L^1$=benzene or 4-isopropyltoluene and $L^2$=H, methyl, or ethyl.

According to the invention, it is preferred, in another aspect, that the following apply to the metal complex of formula (I):
M=In,
$L^1$=Cl, H, methyl, ethyl, propyl, isopropyl, or tert-butyl, with x=1,
$L^2$=Cl, H, methyl, ethyl, propyl, isopropyl, or tert-butyl, with y=1,
z=1, and
n=2.

Such a preferred metal complex has the formula (Ib).

The metal complex of formula (Ib) may be very volatile and, at room temperature, liquid, but still stable at higher temperatures. The metal complex of formula (Ib) cannot have too high decomposition temperatures. The metal complex of formula (Ib) can, synthetically, be accessible via a few stages. In case of the metal complex of the formula (Ib), upon decomposition, reductive elimination of (hydra) can be effected more easily.

According to the invention, it is preferred, for the metal complex of formula (Ib), that $L^1$=H, methyl, or ethyl and $L^2$=H, methyl, or ethyl.

According to the invention, it is generally preferred, for the metal complex—in particular, for the metal complexes of the formulae (Ia) and (Ib)—that $L^2$ be either H, methyl, ethyl, propyl, isopropyl, or tert-butyl. It is more preferable that $L^2$ be either methyl or ethyl. If $L^2$ is ethyl, $L^2$ upon decomposition may become a hydrido ligand (H) in situ through separation of a beta-H. The volatility of a preferred metal complex with $L^2$=H, methyl, ethyl, propyl, isopropyl, or tert-butyl can still further be improved. Reductive elimination of (hydra) from a preferred metal complex with $L^2$=methyl or ethyl can be carried out even more easily.

The metal complex according to the invention is preferably a metal complex of the formula (Ia) or a metal complex of the formula (Ib).

Metal complexes that are particularly preferred according to the invention are [RuCl(p-cymene)(hydra)], [RuMe(p-cymene)(hydra)], and [InMe$_2$(hydra)]$_2$.

According to the invention, it is preferred that the metal atom M and the ligand (hydra) in the metal complex according to the invention form a ring. Here, (hydra) coordinates either via two of its atoms to the same metal atom M of a mononuclear metal complex (n=1) or (hydra) coordinates via a first of its atoms to a first metal atom M and via a second of its atoms to a second metal atom M of a dinuclear metal complex (n=2).

Without being bound by theory, it is believed that, in mononuclear metal complexes according to the invention, (hydra) coordinates in a chelating fashion to M. Without being bound by theory, it is expected that, depending upon the hardness of M (hardness as defined by Pearson) or the ratio of charge to radius of M, the following three coordination modes occur:

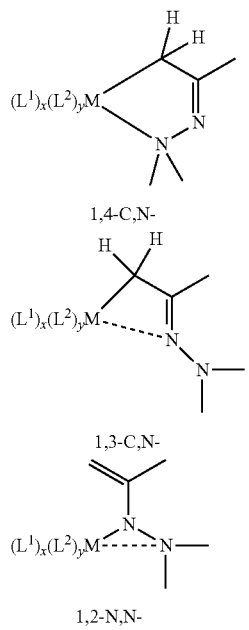

What is depicted is a mononuclear (hydra) metal complex of a metal M having three different, chelating coordination modes. A 1,4-C,N coordination mode, a 1,3-C,N coordination mode, and a 1,2-N,N coordination mode are shown. The ligand (hydra) may help stabilize volatile and/or metastable metal complexes. Without being bound by theory, it is believed that the ligand (hydra) can stabilize volatile and/or metastable metal complexes—especially, via a C∩N chelate ring configuration. The increased stability improves the suitability of corresponding metal complexes for gas-phase thin-film methods. The increased stability improves, in particular, the suitability of corresponding metal complexes for the metallization of substrate surfaces by means of CVD or ALD processes.

According to the invention, it is preferred that, in the metal complex, (hydra) be coordinated to M via an sp$^3$-hybridized N atom. In the metal complex according to the invention, such coordination may favor a C∩N chelate ring configuration. A C∩N chelate ring configuration may help stabilize the metal complex.

According to the invention, it is at the same time or alternatively preferred that, in the metal complex, (hydra) be coordinated to M via an sp$^2$-hybridized N atom. In the metal complex according to the invention, such coordination may favor alternative chelate ring configurations. Alternative chelate ring configurations may contribute to a larger structural variety and thus to a larger variability of the physicochemical properties of the metal complexes of the present invention.

What is also included according to the invention are dinuclear metal complexes which, in addition to the coordination modes depicted above, have, derived therefrom, bridging (η-)coordination modes of (hydra). For example, (hydra) may coordinate simultaneously to two metal atoms M with preferably the same atomic number. In case of two metal atoms M of the same atomic number, a homodinuclear dimer is obtained. In such a dinuclear metal complex, the two metal atoms M together with the (hydra) ligands can form, for example, an eight-membered ring.

According to the invention, it is preferred for the metal complex to be liquid under standard conditions. Standard conditions are a temperature of 25° C. and an absolute pressure of 1.105 Pa. The aggregate state, "liquid," includes an oily consistency of the metal complex. Liquidity of the metal complex under standard conditions can improve the suitability of the metal complex for gas-phase thin-film methods.

According to the invention, it is preferred for the metal complex to decompose at temperatures in the range of 100 to 200° C., more preferably in the range of 120 to 180° C., and even more preferably in the range of 140 to 160° C. Decomposition of the metal complex at these temperatures can improve the suitability of the metal complex for gas-phase thin-film methods.

According to the invention, it is preferred for the onset of decomposition of a metal complex according to the invention to be determined by thermal analysis. The thermal analysis is preferably a thermogravimetric analysis (TGA). Thermogravimetric analysis is an analytical method in which mass changes of a sample are measured as a function of temperature and time. In the thermogravimetric analysis, the sample is heated in a crucible. A holder of the crucible is coupled to a scale which registers mass changes during the heating process. If a reduction in mass occurs during the heating process, this can point to a disintegration of the sample.

The TGA takes place, for example, in a temperature range of 25° C. to 800° C. The heating rate for the TGA is typically 10° C./min. Mass reduction caused by evaporation and/or decomposition is preferably tracked by TGA and by simultaneous differential thermal analysis (SDTA). SDTA determines the heat flow using endothermic peaks (e.g., melting point, evaporation from the liquid phase, sublimation below the melting point) or exothermic peaks (e.g., exothermic decomposition reaction). An endothermic peak without loss of mass regularly corresponds to a melting point. An endothermic peak with loss of mass regularly corresponds to evaporation. An exothermic peak with loss of mass regularly corresponds to decomposition. These parameters can be determined experimentally via onset values. For example, it is possible to specify the temperature of a TGA/SDTA at which the mass of the sample of the metal complex analyzed is reduced by 3 wt % (3% reduction). It is additionally possible, for example, to specify the temperature ($T_{M4}$) of a TGA/SDTA at which a further mass reduction occurs after the initial reduction in the mass of the sample analyzed by 3 wt %.

According to the invention, it is preferred that, in a thermogravimetric analysis, the temperature of the first 3 wt % mass reduction of the metal complex at 1.105 Pa be in the range of 100 to 200° C., more preferably in the range of 120 to 180° C., and even more preferably in the range of 140 to 160° C. According to the invention, it is preferred that, following the first mass reduction of 3 wt % in a thermogravimetric analysis at 1.105 Pa in the range of $T_{MA}$=160 to 200° C., a further mass reduction of the metal complex occur.

The invention also relates to a method for producing a metal complex according to the invention, comprising the steps of:
(i) reacting acetone dimethylhydrazone with a Li-organic compound to produce Li(hydra),
(ii) reacting Li(hydra) with a compound having the formula $[ML^1{}_{x1}L^2{}_{y1}]_{n1}$, with $x_1$=0, 1, or 2, $y_1$=0, 1, or 2, $n_1$=1 or 2, to produce a compound of the formula $[M(L^1)_x(L^2)_y(hydra)_z]_n$.

The method according to the invention can, in a simple synthesis under mild conditions and via a few stages, provide a metal complex according to the invention having the above-mentioned desired properties on an industrial scale at high yields.

According to the invention, it is preferred that, in the method according to the invention, $L^2$ be either H, methyl, ethyl, propyl, isopropyl, or tert-butyl or, following step (ii), be converted to H, methyl, ethyl, propyl, isopropyl, or tert-butyl in a step (iii). In these cases, the ligand $L^2$ can be easily introduced synthetically into the metal complex according to the invention. In these cases, the ligand $L^2$ may provide metal complexes with an advantageous tendency to reductively eliminate (hydra) upon decomposition.

The invention also relates to the use of a metal complex according to the invention for depositing the metal in a CVD process or an ALD process.

This use according to the invention allows for the metal to be deposited in the form of thin layers. Here, the incorporation of carbon and other impurities can be minimized or avoided.

The invention also relates to a method in which a metal complex according to the invention is used as a precursor for producing a layer from the metal.

By this method according to the invention, the layer of metal can be produced in the form of a thin layer. Here, the incorporation of carbon and other impurities can be minimized or avoided.

The invention also relates to a metallized surface obtainable by depositing a metal on a surface from a gas phase comprising a metal complex according to the invention.

According to the invention, this makes it possible to provide a metallized surface where the incorporation of carbon and other impurities is minimized or completely avoided.

General Synthesis Routes

Acetone dimethylhydrazone (H-hydra) is known in the literature.[5]-[7] H-hydra can be prepared by means of a simple condensation reaction of acetone and N,N-dimethylhydrazine.

In the present invention, the preparation of H-hydra can take place, for example, by reacting equimolar amounts of acetone and N,N-dimethylhydrazine by adding $MgSO_4$ to capture accruing $H_2O$. For example, the mixture can be heated for 7 hours under reflux conditions:

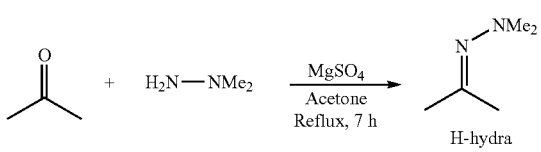

H-hydra is a non-air-sensitive, distillable liquid and CH acid. In the present invention, H-hydra is preferably converted to the deprotonated (lithiated) ligand Li(hydra). The deprotonation of H-hydra can take place in situ. For this purpose, H-hydra is, for example, first put into THF. H-hydra can then be deprotonated—for example, with n-BuLi. Such in situ reactions are known.[7]-[9]

According to the invention, it is preferred that the preparation of Li(hydra) be effected by first putting H-hydra into n-hexane at 0° C. with dropwise addition of an nBuLi solution. The resulting solid can be separated by filtration and dried in a fine vacuum. An isomer mixture of Li(hydra) is regularly obtained:

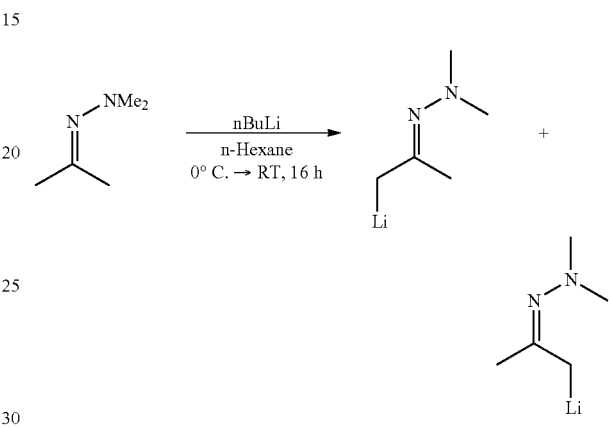

Without being bound by theory, it is included according to the invention that the N-amino enamide form or enhydrazide form described below be present in such a mixture of isomers:

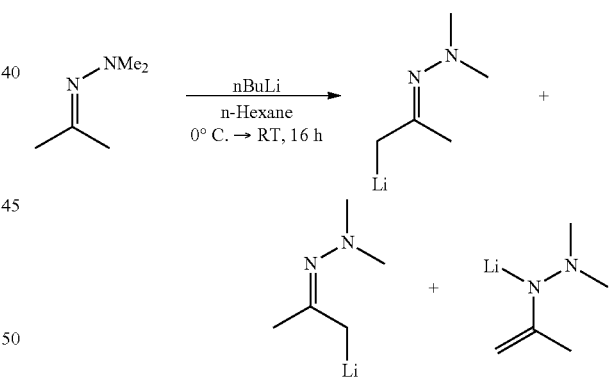

According to the invention, the deprotonated (lithiated) ligand Li(hydra) serves subsequently for preparing hydrametal complexes according to the invention.

Preparations of metal complexes of the formula [(arene)RuCl(hydra)] are described by way of example (the arene ligand is preferably benzene or para-cymene):

Li(hydra) is first put into toluene at 0° C. The compound $[RuCl_2(arene)]_2$ is added there. Processing takes place by removing the solvent in a fine vacuum. The residue is taken up in n-hexane. Thereafter, filtration with Celite® takes place. The filtrate is dried in a fine vacuum. The target compound is isolated from the residue by sublimation in a fine vacuum at 120° C. The following exemplary reaction scheme may be given:

2 Li(hydra) +

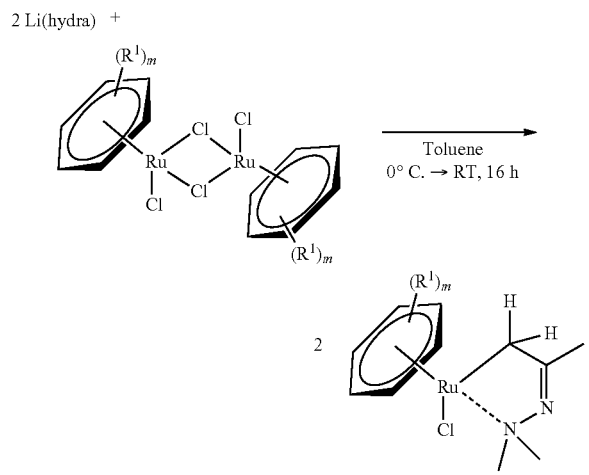

According to the invention, the chlorido ligand on ruthenium can, subsequently, preferably be substituted. Substitution can be done with equimolar amounts of MeLi to introduce a methyl group. Substitution can be done with 0.3 equivalent LiAlH$_4$ to introduce a hydrido ligand. In both cases, processing can be carried out as follows: Removal of the solvent in a fine vacuum, take-up of the residue in n-hexane, filtration with Celite®, drying of the filtrate in a fine vacuum (FV), and isolation of the target compounds by recondensation (FV/100° C.) from the residues obtained. The following exemplary reaction scheme may be given:

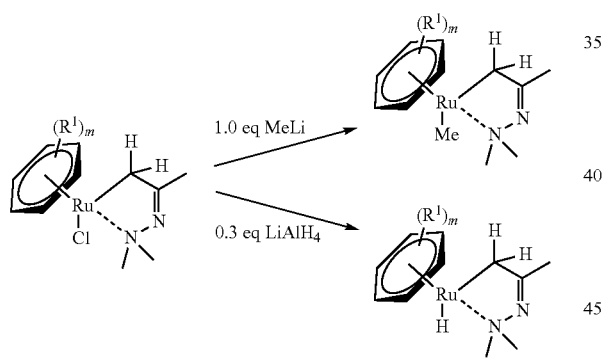

The following complex groups and complexes can be synthesized in an analogous manner:

[Ru($\eta^6$-arene$^R$)R$^2$(hydra)], with:
arene$^R$=substituted arene, R$^2$=hydrido, methyl, ethyl, chlorido

[Ru($\eta^5$-Cp$^R$)L$^N$(hydra)], with:
Cp$^R$=substituted cyclopentadienyl,
L$^N$=2-electron neutral ligand—preferably CO, CNMe, PH$_3$

[Co(hydra)$_2$]; [InMe$_2$($\eta$-hydra)]$_2$ or [Me$_2$In($\eta$-hydra)$_2$InMe$_2$]; [GeH$_2$(hydra)$_2$]; [Bi(hydra)$_3$]

The metal complexes preparable according to the invention with (hydra)ligand are regularly metastable, volatile, and readily evaporable complexes. They are therefore particularly suitable as precursors in gas-phase thin-film methods such as CVD and ALD. The preferred synthetic routes given as examples herein provide inexpensive, easily accessible metal complexes that can be isolated in an analytically pure fashion on a large scale.

Applications for the Complexes According to the Invention

The metal complexes according to the invention are used as precursors for metals or metal layers. They can be used in particular for the production of thin layers from a metal by means of gas-phase thin-film methods such as CVD and ALD.

Gas-phase thin-film methods include a gas phase reaction that generally takes place at or near a surface of a substrate. Reactants or precursors involved in the reaction are fed in the form of gases to the substrate to be coated. The substrate is arranged in a reaction chamber and is heated. The mostly preheated gases are thermally activated by the heated substrate and react with one another or the substrate. Precursors contained in the gases are thermally decomposed by the heated substrate. Thereby, the desired material is deposited and chemically bonded. Chemisorption of the desired material occurs—in the present invention, of the metal having the atomic number selected from ranges a) 21 to 33, with the exception of 30, b) 39 to 51, with the exception of 48, and c) 71 to 83, with the exception of 80.

The ALD process, also referred to as atomic layer deposition, is a modified CVD process. With the ALD process, the reaction or sorption at the surface ceases after complete occupancy of the surface. This self-limiting reaction is carried out in several cycles that are limited by rinsing steps in-between. Very precise layer thicknesses are achieved this way.

As described above, the metal complexes according to the invention can be prepared by industrial synthesis that requires only little effort. Simple technical synthesis is an important advantage in an industrial application of the metal complexes according to the invention in vapor deposition processes. Another important reason for the particular suitability of the metal complexes according to the invention for CVD and/or ALD processes is that the metal complexes according to the invention are volatile compounds which are partially liquid at room temperature. In addition, they can be successfully decomposed into the corresponding elemental metal. Therefore, when it comes to the deposition of such elemental metals, they constitute an advantageous alternative to known precursors for the corresponding metals.

EXEMPLARY EMBODIMENTS

In the following examples:
H-hydra means: acetone dimethylhydrazone
hydra means: acetone dimethylhydrazone anion
p-cymene means: 4-isopropyltoluene Example 1—Preparation of H-Hydra

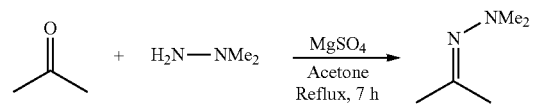

MgSO$_4$ (15.0 g) was first put into acetone (50 mL, exc.), and N,N-dimethylhydrazine (16.4 g/20.6 mL, 272 mmol, 1.0 eq) was added to the suspension while stirring. The mixture was heated for 7 hours under reflux conditions and then filtered by means of a folded filter. After extraction of the solid with acetone (15 mL), the filtrate was freed from the solvent in vacuo, and acetone dimethylhydrazone was obtained as a colorless liquid (14.8 g, 147 mmol, 54%).

| ¹H-NMR | CDCl₃, 300.2 MHz: δ/ppm = 2.39 (s, 6 H, NMe₂), 1.93 (s, 3 H, Me), 1.88 (s, 3 H, Me). |
|---|---|
| ¹H-NMR | C₆D₆, 300.2 MHz: δ/ppm = 2.39 (s, 6 H, NMe₂), 1.70 (s, 3 H, Me), 1.70 (s, 3 H, Me). |
| ¹³C-NMR | C₆D₆, 75.5 MHz: δ/ppm = 163.5 (C$_q$), 47.2 (NMe₂), 24.9 (Me), 17.6 (Me). |
| HR-EI(+)-MS | Calculated for [M + H]⁺ = 101.1073 m/z, found: 101.1071 m/z. |

Example 2—Preparation of Li(Hydra)

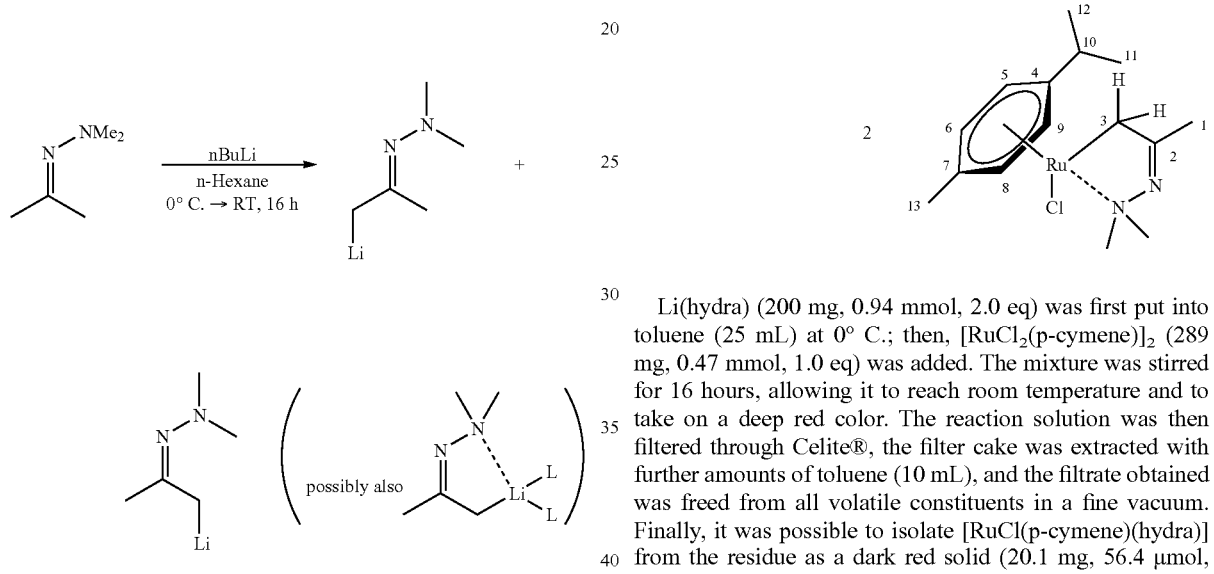

n-hexane (100 mL) was added to acetone dimethylhydrazone (14.8 g, 147 mmol, 1.0 eq), and the mixture was cooled to 0° C. An nBuLi solution (2.43 M in n-hexane, 60.5 mL, 147 mmol, 1.0 eq) was added via a dropping funnel over a period of two hours, wherein precipitation of a colorless solid was observed. The mixture was stirred overnight, wherein it could warm to room temperature. The resulting solid was separated by filtration, washed with n-hexane (30 mL), and finally dried in vacuo. Li(hydra) could be obtained as a colorless solid.

| ¹H-NMR | (THF-d₈, 300.2 MHz): δ/ppm = 1.98 (s, 6 H, NMe₂), 1.56 (s, 2.5 H, CH$_{2.5}$), 1.48 (s, 2.5 H, CH$_{2.5}$). |
|---|---|
| ¹H-NMR | (toluene-d₈, 300.2 MHz): δ/ppm = 2.37 (s, 6 H, NMe₂), 1.70 (s, 5 H, CH₂ + CH₃). |
| ¹³C-NMR | (THF-d₈, 75.5 MHz): δ/ppm = 163.6 (C$_q$), 47.2 (NMe₂), 17.5 (Me). |
| ⁷Li-NMR | (THF-d₈, 116.7 MHz): δ/ppm = 1.37 (s), 0.53 (s). |
| Ultimate analysis | C₅H₁₁N₂Li (106.10 g/mol) |
| | calculated: C: 56.60%, H: 10.45%, N: 26.40% |
| | found: C: 54.29%, H: 9.41%, N: 24.21%. |

Example 3—Preparation of [RuCl(P-Cymene)(Hydra)]

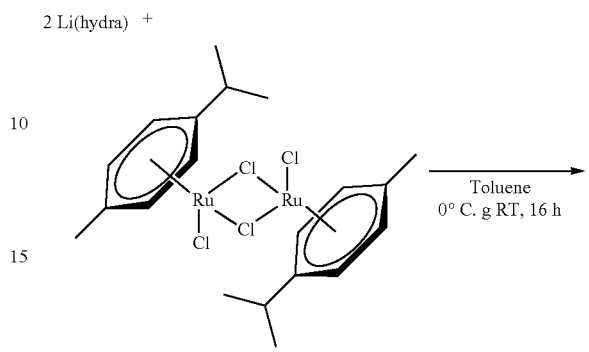

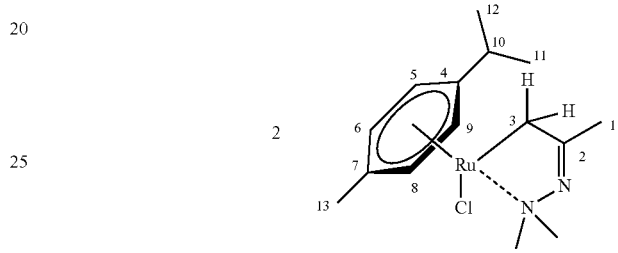

Li(hydra) (200 mg, 0.94 mmol, 2.0 eq) was first put into toluene (25 mL) at 0° C.; then, [RuCl₂(p-cymene)]₂ (289 mg, 0.47 mmol, 1.0 eq) was added. The mixture was stirred for 16 hours, allowing it to reach room temperature and to take on a deep red color. The reaction solution was then filtered through Celite®, the filter cake was extracted with further amounts of toluene (10 mL), and the filtrate obtained was freed from all volatile constituents in a fine vacuum. Finally, it was possible to isolate [RuCl(p-cymene)(hydra)] from the residue as a dark red solid (20.1 mg, 56.4 μmol, 12%) by means of sublimation (FV/120° C.).

| ¹H-NMR | (C₆D₆, 300.2 MHz): 4.74 (d, ³J$_{HH}$ = 5.6 Hz, 1 H, H-5), 4.45 (d, ³J$_{HH}$ = 5.8 Hz, 1 H, H-6), 4.18 (d, ³J$_{HH}$ = 5.6 Hz, 1 H, H-9), 3.91 (d, ³J$_{HH}$ = 5.8 Hz, 1 H, H-8), 3.46 (d, ²J$_{HH}$ = 15.6 Hz, 2 H, H-3), 3.28 (s, 3 H, H-13), 3.20 (d, ²J$_{HH}$ = 15.6 Hz, 1 H, H-3), 2.73 (sept, 1 H, H-10), 2.24 (s, 3 H, NMe₂), 2.01 (s, 3 H, H-1), 1.71 (s, 3 H, NMe₂), 1.16 (d, ³J$_{HH}$ = 6.9 Hz, 3 H, H-11/12), 1.07 (d, ³J$_{HH}$ = 7.1 Hz, 3 H, H-11/12). |
|---|---|
| ¹³C-NMR | (C₆D₆, 75.5 MHz): δ/ppm = 181.5 (C-2), 108.5 (C-4), 93.0 (C-7), 82.5 (C-6/8), 81.3 (C-5/9), 80.8 (C-6/8), 79.7 (C-5/9), 59.3 (NMe₂), 56.1 (NMe₂), 37.8 (C-3), 31.2 (C-10), 23.3 (C-11/12), 22.0 (C-11/12), 21.4 (C-1), 17.9 (C-13). |
| HR-EI(+)-MS | calculated for: [M]⁺ = 370.0750 m/z, found: 370.0881 m/z. |
| Ultimate analysis | C₁₅H₂₅N₂ClRu (369.90 g/mol) |
| | calculated: C: 48.71%, H: 6.81%, N: 7.57% |
| | found: C: 49.50%, H: 6.80%, N: 8.67%. |
| TGA | (T$_S$ = 25° C., T$_E$ = 800° C., 10° C./min, m = 5.05 mg) stages: 2, T = 156.1° C. (3% reduction), T$_{MA}$ = 184.0° C. (1st process), T$_{MA}$ = 262.0 (2nd process), total mass reduction: 3.73 mg (73.8%). |
| SDTA | (T$_S$ = 25° C., T$_E$ = 800° C., 10° C./min, m = 5.05 mg) T$_M$(onset) = 88.4° C., T$_M$(max) = 98.4° C. (endothermic), T$_{D1}$(onset) = 163.2° C., T$_{D1}$(max) = 180.3° C. (exothermic), T$_{D2}$(onset) = 252.3° C., T$_{D2}$(max) = 263.0° C. (exothermic). |

Example 4—Preparation of [RuMe(P-Cymene)(Hydra)]

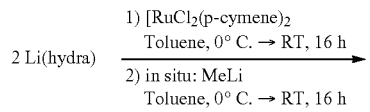

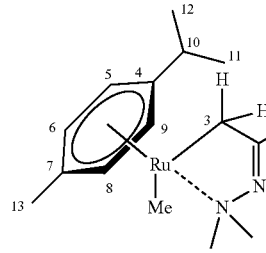

Li(hydra) (200 mg, 0.94 mmol, 2.0 eq) was first put into toluene (25 mL) at 0° C.; then, [RuCl$_2$(p-cymene)]$_2$ (289 mg, 0.47 mmol, 1.0 eq) was added. The mixture was stirred for 16 hours, allowing it to reach room temperature and to take on a deep red color. MeLi (0.94 mmol, 2.0 eq) was added in situ at 0° C. After a reaction time of 16 hours, during which time the mixture was allowed to reach room temperature, all volatile constituents were removed in a fine vacuum. The residue obtained was taken up in n-hexane (10 mL), filtered through Celite®, and the filter cake extracted with further amounts of n-hexane (10 mL). After the filtrate had been dried in a fine vacuum, it was possible to precipitate [RuMe(p-cymene)(hydra)] in a fine vacuum at 110° C. from the residue as a yellow oil.

| | |
|---|---|
| $^1$H-NMR | (C$_6$D$_6$, 300.2 MHz): 4.27-4.21 (m, 3 H, H-5, H-9, H-8), 4.05 (d, $^3J_{HH}$ = 5.5 Hz, H-6), 3.34 (d, $^2J_{HH}$ = 16.5 Hz, H-3), 2.66 (s, 3 H, NMe$_2$), 2.49 (sept, 1 H, H-10), 2.48 (s, 3 H, NMe$_2$), 2.11 (d, $^2J_{HH}$ = 16.7 Hz, H-3), 2.06 (s, 3 H, H-1), 1.89 (s, 3 H, H-13), 1.12 (d, $^3J_{HH}$ = 6.8 Hz, H-11, H-12), 0.46 (s, 3 H, RuMe). |
| HR-EI(+)-MS | calculated for: [M]$^+$ = 370.0750 m/z, found: 370.0881 m/z. |
| TGA | (T$_S$ = 25° C., T$_E$ = 600° C., 10° C./min, m = 9.70 mg) stages: 1, T = 146.1° C. (3% reduction), T$_{MA}$ = 179.8° C., total mass reduction: 6.12 mg (63.0%). |
| SDTA | (T$_S$ = 25° C., T$_E$ = 600° C., 10° C./min, m = 9.70 mg) T$_D$(onset) = 161.9° C., T$_D$(max) = 178.2° C. (exothermic). |

Example 5—Preparation of [InMe$_2$(Hydra)]$_2$

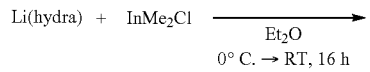

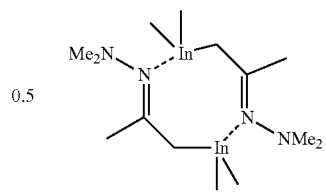

Li(hydra) (300 mg, 2.83 mmol, 1.0 eq) and InMe$_2$Cl (510 mg, 2.83 mmol, 1.0 eq) were provided together, cooled to 0° C., and then cold Et$_2$O (0° C., 15 mL) was added. The mixture was stirred for 5 hours at 0° C. and was then allowed to warm to room temperature over 16 hours. The suspension was filtered through Celite®, and the filter cake was extracted with further amounts of Et$_2$O (10 mL). The filtrate was freed from the solvent in a fine vacuum, and the remaining yellow oil was freeze-dried several times. The viscous oil was then re-condensed in a fine vacuum at 120° C. In this case, it was also possible to isolate a viscous oil, from which colorless crystals of the dinuclear target compound crystallized out.

| | |
|---|---|
| $^1$H-NMR | (C$_6$D$_6$, 300.2 MHz): 2.13 (s, 6 H, NMe$_2$), 1.92 (s, 3 H, CH$_3$), 1.28 (s, 2 H, CH$_2$), −0.11 (s, 6 H, InMe$_2$). |
| HR-EI(+)-MS | calculated for [InMe$_2$]$^+$: m/z = 144.9508, found: m/z = 144.9536. calculated for [C$_6$H$_{14}$N$_2$hydra]$^+$: m/z = 114.1157, found: m/z = 114.9082. calculated for [C$_2$H$_6$NNMe$_2$]$^+$: m/z = 44.0500, found: m/z = 43.9963. |

Single crystal X-ray structure analysis was able to determine that it is a homodinuclear indium complex with a bridging C,N coordination mode. According to its structure, the complex of this example can also be expressed with the following formula: [Me$_2$In(η-hydra)$_2$InMe$_2$].

Literature

[1] T. Fujisawa, M. Takeuchi, T. Sato, *Chemistry Letters*, 1982, 1521-1524
[2] D. J. Cárdenas, A. M. Echavarren, A. Vegas, *Organometallics* 1994, 13, 882-889
[3] S. Javed, D. M. Hoffman, *Inorganic Chemistry* 2008, 47, 11984-11992
[4] S. Javed, D. M. Hoffman, *Eur. J. Inorg. Chem.* 2008, 47, 5251-5256
[5] R. H. Wiley, S. C. Slaymaker, H. Kraus, *J. Org. Chem.* 1957, 22, 204-207
[6] C. Qi, F. Hasenmaile, V. Gandon, D. Laboef, *ACS Catalysis* 2018, 8, 1734-1739
[7] E. J. Corey, D. Enders, *Chem. Ber.* 1978, 111, 1362-1383.
[8] P. Y. Géant, E. Grenet, J. Martinez, X. J. Salom-Roig, *Tetrahedron Asymmetry* 2016, 27, 22-30,
[9] D. Enders, W. Dahmen, E. Dederichs, W. Gatzweiler, P. Weuster, *Synthesis (Stuttg).* 1990, 11, 1013-1019.

The invention claimed is:
1. A metal complex of formula (I):

[M(L$^1$)$_x$(L$^2$)$_y$(hydra)$_z$]$_n$         formula (I)

wherein:
M = selected from the group consisting of Co, Ga, Ge, Ru, In, and Ir,

L$^1$ = neutral or anionic ligand, with x = 0 or 1,
L$^2$ = neutral or anionic ligand, with y = 0 or 1,
(hydra) = acetone dimethylhydrazone monoanion, with z = 1, 2, or 3,
n = 1 or 2, and the total charge of the complex is 0.

2. The metal complex according to claim 1, wherein M is selected from the group consisting of and In.
3. The metal complex according to claim 1, wherein L$^1$ and L$^2$ are independently selected from the group consisting of Cl, H, methyl, ethyl, propyl, isopropyl, tert-butyl, cyclopentadienyl, methylcyclopentadienyl, isopropylcyclopentadienyl, arene, phosphine, isonitrile, and carbonyl.

4. The metal complex according to claim 1, wherein x=y=1, wherein, optionally, z=1.

5. The metal complex according to claim 1, wherein

---
M = Ru,
$L^1$ = arene, with x = 1,
$L^2$ = Cl, H, methyl, ethyl, propyl, isopropyl, or tert-butyl, with y = 1,
z = 1, and
n = 1.

---

6. The metal complex according to claim 5, wherein the arene is an arene substituted with 1 to 6 identical or different $C_1$-$C_8$ hydrocarbon radicals or is an unsubstituted arene.

7. The metal complex according to claim 6, wherein the arene is selected from 4-isopropyltoluene and benzene.

8. The metal complex according to claim 1, wherein

---
M = In,
$L^1$ = Cl, H, methyl, ethyl, propyl, isopropyl, or tert-butyl, with x = 1,
$L^2$ = Cl, H, methyl, ethyl, propyl, isopropyl, or tert-butyl, with y = 1,
z = 1, and
n = 2.

---

9. The metal complex according to claim 1, wherein $L^2$ is selected from methyl and ethyl.

10. The metal complex according to claim 1, the metal complex is selected from the group consisting of [RuCl(p-cymene)(hydra)], [RuMe(p-cymene)(hydra)], and [InMez(hydra)]2.

11. A method for producing the metal complex according to claim 1, comprising the steps of:
 (i) reacting acetone dimethylhydrazone with a Li-organic compound to produce Li(hydra),
 ii) reacting Li(hydra) with a compound having the formula $[ML^1_{x1}L^2_{y1}]_{n1}$, with $x_1$=0, 1, or 2, $y_1$=0, 1, or 2, $n_1$=1 or 2, to produce a compound of the formula $[M(L^1)_x(L^2)_y(\text{hydra})_z]_n$.

12. The method according to claim 11, wherein $L^2$ is either H, methyl, ethyl, propyl, isopropyl, or tert-butyl or, following step (ii), is converted to H, methyl, ethyl, propyl, isopropyl, or tert-butyl in a step (iii).

13. A method for depositing a metal in a CVD or an ALD process on a substrate, which comprises depositing the metal complex of claim 1 in a gas phase on the substrate.

* * * * *